(12) United States Patent
Shigemoto et al.

(10) Patent No.: US 11,145,616 B2
(45) Date of Patent: Oct. 12, 2021

(54) SEMICONDUCTOR DEVICE, POWER CONVERSION APPARATUS, AND METHOD FOR MANUFACTURING SEMICONDUCTOR DEVICE

(71) Applicant: Mitsubishi Electric Corporation, Tokyo (JP)

(72) Inventors: Takumi Shigemoto, Tokyo (JP); Satoru Ishikawa, Tokyo (JP); Yuji Imoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 3 days.

(21) Appl. No.: 16/492,517

(22) PCT Filed: Jun. 22, 2017

(86) PCT No.: PCT/JP2017/023044
§ 371 (c)(1),
(2) Date: Sep. 9, 2019

(87) PCT Pub. No.: WO2018/235232
PCT Pub. Date: Dec. 27, 2018

(65) Prior Publication Data
US 2020/0321306 A1      Oct. 8, 2020

(51) Int. Cl.
*H01L 41/193*      (2006.01)
*H01L 41/047*      (2006.01)
(Continued)

(52) U.S. Cl.
CPC ............ *H01L 24/48* (2013.01); *H01L 23/047* (2013.01); *H01L 23/3735* (2013.01);
(Continued)

(58) Field of Classification Search
CPC ... H01L 23/047; H01L 23/3735; H01L 24/48; H01L 24/73; H01L 25/50; H01L 25/072;
(Continued)

(56) References Cited

U.S. PATENT DOCUMENTS

2005/0142391 A1*   6/2005   Dmitriev ................. C30B 25/00
                                                                428/698
2013/0187627 A1*   7/2013   Imada ................... H01L 27/088
                                                                323/311

FOREIGN PATENT DOCUMENTS

JP         2001-298033 A       10/2001
JP         2008-306792 A       12/2008
(Continued)

OTHER PUBLICATIONS

International Search Report issued in PCT/JP2017/023044; dated Sep. 19, 2017.
(Continued)

*Primary Examiner* — Shawki S Ismail
*Assistant Examiner* — Monica Mata
(74) *Attorney, Agent, or Firm* — Studebaker & Brackett PC

(57) ABSTRACT

The semiconductor device includes a semiconductor element substrate having an insulation property, and a wire for positioning the semiconductor element with respect to the semiconductor element substrate. The semiconductor element substrate includes a disposition region for disposing the semiconductor element. The wire is provided at least at a part of the periphery of the disposition region.

9 Claims, 9 Drawing Sheets

(51) Int. Cl.
*H01L 41/45* (2013.01)
*H01L 41/113* (2006.01)
*H01L 23/00* (2006.01)
*H01L 23/047* (2006.01)
*H01L 23/373* (2006.01)
*H01L 25/07* (2006.01)
*H01L 25/00* (2006.01)
*H02M 7/00* (2006.01)
*H02M 7/44* (2006.01)
*H02P 27/06* (2006.01)

(52) U.S. Cl.
CPC ............ *H01L 24/73* (2013.01); *H01L 25/072* (2013.01); *H01L 25/50* (2013.01); *H02M 7/003* (2013.01); *H02M 7/44* (2013.01); *H01L 2224/48137* (2013.01); *H01L 2224/48225* (2013.01); *H01L 2224/73265* (2013.01); *H01L 2924/1033* (2013.01); *H01L 2924/10254* (2013.01); *H01L 2924/10272* (2013.01); *H01L 2924/13055* (2013.01); *H01L 2924/13091* (2013.01); *H02P 27/06* (2013.01)

(58) Field of Classification Search
CPC . H01L 2224/48137; H01L 2224/48225; H01L 2224/73265; H01L 2924/1033; H01L 2924/10254; H01L 2924/10272; H01L 2924/13055; H01L 2924/13091; H02M 7/003; H02M 7/44; H02P 27/06
See application file for complete search history.

(56) References Cited

FOREIGN PATENT DOCUMENTS

| | | |
|---|---|---|
| JP | 2009-253131 A | 10/2009 |
| JP | 2015-076511 A | 4/2015 |
| JP | 2017-005007 A | 1/2017 |

OTHER PUBLICATIONS

An Office Action; "Notification of Reasons for Refusal," mailed by the Japanese Patent Office dated Jan. 5, 2021, which corresponds to Japanese Patent Application No. 2019-524802 and is related to U.S. Appl. No. 16/492,517 with English language translation.

An Office Action; "Notification of Reasons for Refusal," mailed by the Japanese Patent Office dated Jul. 14, 2020, which corresponds to Japanese Patent Application No. 2019-524802 and is related to U.S. Appl. No. 16/492,517 with English language translation.

\* cited by examiner

SEMICONDUCTOR DEVICE, POWER CONVERSION APPARATUS, AND METHOD FOR MANUFACTURING SEMICONDUCTOR DEVICE

TECHNICAL FIELD

The present invention relates to a semiconductor device, a power conversion apparatus and a semiconductor disposition method having a configuration for positioning a semiconductor element.

BACKGROUND ART

With the development of industrial equipment, trains, vehicles, and the like, the operating temperature of semiconductor elements used for them also rises. In recent years, development of semiconductor elements that operate even at high temperatures has been energetically carried out, and miniaturization, higher withstand voltage, higher current density, and the like of semiconductor elements have advanced. In particular, a wide band gap semiconductor made of SiC, GaN, or the like has a band gap larger than that of a Si semiconductor. Therefore, the wide band gap semiconductor is expected in higher withstand voltage, miniaturization, higher current density of the semiconductor device, and higher temperature operation of the semiconductor device.

In semiconductor devices, semiconductor elements having different types, dimensions, shapes, and the like are used depending on applications. Therefore, the number of types of semiconductor elements used for semiconductor devices is very large. Methods of positioning a semiconductor element include a method of using a jig. In the method, there is a problem that it is necessary to replace and manage the jig every time the semiconductor element to be used is switched.

Patent Document 1 discloses a configuration for positioning a semiconductor element (hereinafter, also referred to as a "related configuration A"). Specifically, in the related configuration A, a groove or a protrusion is provided at the periphery of the mounting area of the semiconductor element.

In addition, Patent Document 2 discloses a configuration for positioning a semiconductor element (hereinafter, also referred to as a "related configuration B"). In the related configuration B, positioning of the semiconductor element is performed by a closed loop shaped resin material and a bonding material. The resin material is a thermosetting resin, such as an epoxy-based resin, for example. The bonding material is a sintering metal material. Specifically, in the related configuration B, a closed loop shaped resin material is provided on the conductor layer formed on the substrate. In addition, the bonding material is provided inside the closed loop shaped resin material. In such a configuration, a semiconductor element is mounted on the bonding material.

PRIOR ART DOCUMENTS

Patent Documents

Patent Document 1: Japanese Patent Application Laid-Open No. 2001-298033
Patent Document 2: Japanese Patent Application Laid-Open No. 2017-005007

SUMMARY

Problem to be Solved by the Invention

In the related configuration A, a groove or a protrusion that can fit only one type of semiconductor element having a predetermined size is provided in the lead frame. Therefore, the related configuration A cannot cope with the positioning of a plurality of types of semiconductor elements.

It should be noted that in the related configuration B, a closed loop shaped resin material is used for positioning the semiconductor element. Changing the position of the resin material makes it possible to cope with positioning of a plurality of types of semiconductor elements. However, the resin material may peel off from the substrate depending on the state of heat applied to the substrate in high temperature environment. Therefore, in the related configuration B, there is a problem that the semiconductor element may not be positioned depending on the state of heat applied to the substrate.

Therefore, there is a need for a configuration that can position the semiconductor element without being substantially affected by the heat applied to the substrate.

The present invention has been made to solve such problems, and has an object to provide a semiconductor device or the like capable of positioning a semiconductor element without being substantially affected by heat applied to the substrate.

Means to Solve the Problem

In order to achieve the above object, a semiconductor element is disposed in the semiconductor device according to one aspect of the present invention. The semiconductor device includes: a substrate having an insulation property; and at least one wire for positioning the semiconductor element with respect to the substrate in a plan view. The substrate includes a disposition region for disposing the semiconductor element. The wire is provided at least at a part of a periphery of the disposition region.

Effects of the Invention

According to the present invention, the semiconductor device includes a wire for positioning the semiconductor element with respect to the substrate. The substrate includes a disposition region for disposing the semiconductor element. The wire is provided at least at a part of the periphery of the disposition region.

The wire is less likely to undergo deformation or the like than the resin due to the state of heat applied to the substrate. Therefore, a semiconductor device capable of positioning a semiconductor element with almost no influence of heat applied to the substrate can be provided.

The objects, characteristics, aspects, and advantages of the present invention will become more apparent from the following detailed description and the accompanying drawings.

DESCRIPTION OF EMBODIMENTS

Figure 1:
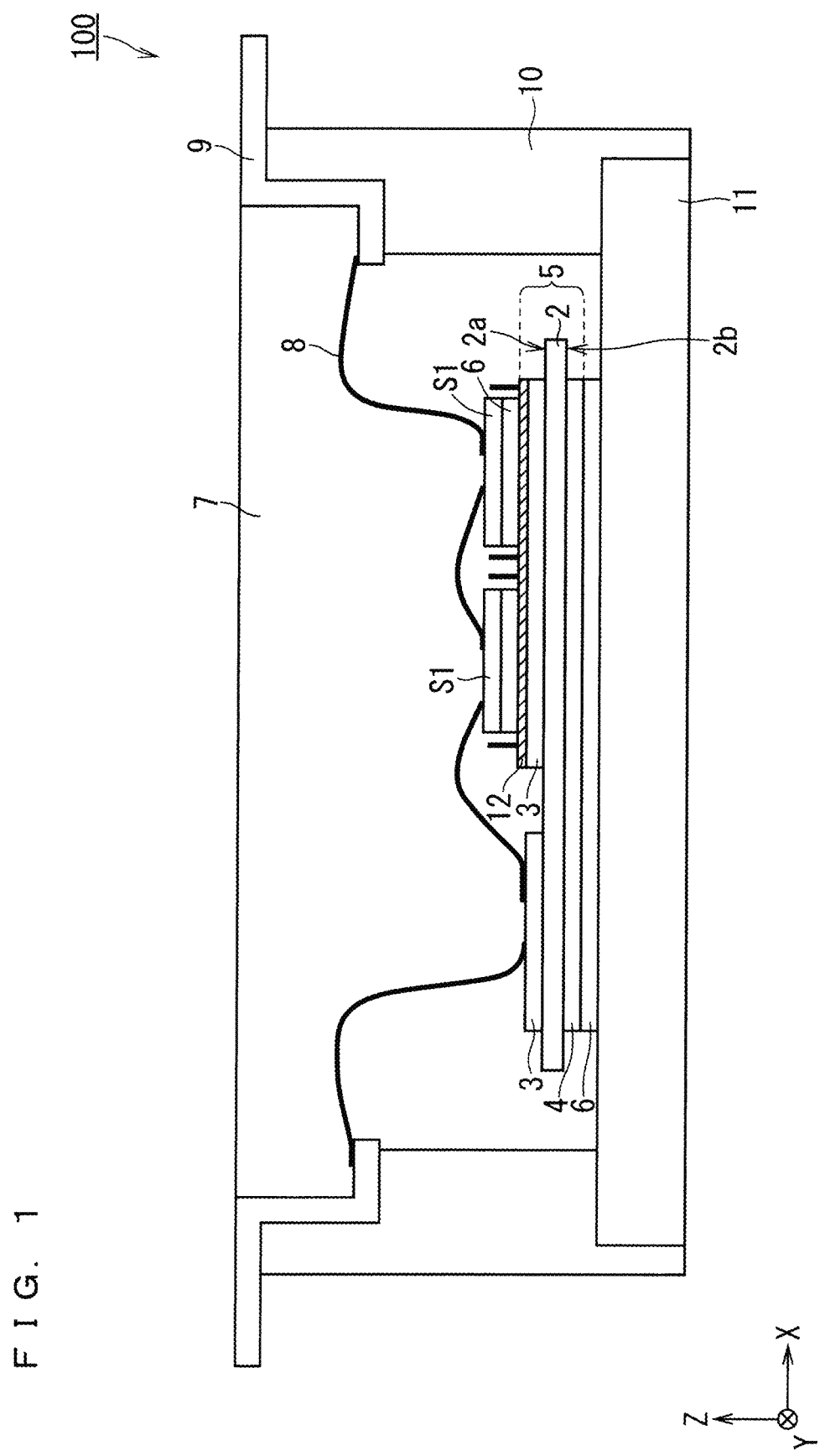
FIG. 1 is a cross-sectional view of a semiconductor device according to a first embodiment of the present invention.

Hereinafter, embodiments of the present invention will be described with reference to the drawings. In the following drawings, the same components are denoted by the same reference numerals. The names and functions of respective components denoted by the same reference numerals are the same. Therefore, a detailed description of a part of each component denoted by the same reference numeral may be omitted.

It should be noted that the dimensions, materials, and shapes of components exemplified in the embodiments, relative disposition of such components, and the like may be appropriately changed according to the configuration, various conditions, and the like of the apparatus to which the present invention is applied.

First Embodiment

FIG. 1 is a cross-sectional view of a semiconductor device 100 according to a first embodiment of the present invention. The semiconductor device 100 is a power module for, for example, home appliances, industrial applications, vehicles, trains, and the like.

In FIG. 1, the X direction, the Y direction, and the Z direction are orthogonal to one another. The X, Y, and Z directions illustrated in the following drawings are also orthogonal to one another. Hereinafter, a direction including the X direction and a direction opposite to the X direction (−X direction) is also referred to as an "X-axis direction". In addition, hereinafter, a direction including the Y direction and a direction opposite to the Y direction (−Y direction) is also referred to as a "Y-axis direction". In addition, hereinafter, a direction including the Z direction and a direction opposite to the Z direction (−Z direction) is also referred to as a "Z-axis direction".

In addition, hereinafter, a plane including the X-axis direction and the Y-axis direction is also referred to as an "X-Y plane". In addition, hereinafter, a plane including the X-axis direction and the Z-axis direction is also referred to as an "X-Z plane". In addition, hereinafter, a plane including the Y-axis direction and the Z-axis direction is also referred to as a "Y-Z plane".

Referring to FIG. 1, a semiconductor device 100 includes a plurality of semiconductor elements S1, a semiconductor element substrate 5, a case 10, and a base plate 11.

The semiconductor element substrate 5 is bonded to the base plate 11 via the bonding material 6. The bonding material 6 is, for example, solder. Specifically, the bonding material 6 is, for example, plate solder. The plate solder contains Sn. The semiconductor element substrate 5 is a substrate having a heat dissipation property and an insulation property. The semiconductor element substrate 5 includes an insulating substrate 2, electrode patterns 3 and 4, and plating 12.

The insulating substrate 2 is made of ceramic such as $Al_2O_3$, MN, or $Si_3N_4$. The insulating substrate 2 has a front surface 2a and a back surface 2b. The back surface 2b of the insulating substrate 2 is provided with the electrode pattern 4. The electrode pattern 4 is bonded to the base plate 11 via the bonding material 6. The base plate 11 is made of, for example, copper.

The front surface 2a of the insulating substrate 2 is provided with a plurality of electrode patterns 3. It should be noted that although two electrode patterns 3 are shown in FIG. 1, the number of electrode patterns 3 provided on the front surface 2a of the insulating substrate 2 may be one or three or more. Each of the electrode patterns 3 and 4 is made of, for example, copper.

The entire upper surface of the electrode pattern 3 on which the semiconductor element S1 is to be disposed is subjected to plating. Thus, the plating 12 is present on the entire front surface of the electrode pattern 3 being a portion on which the semiconductor element S1 is to be disposed in the semiconductor element substrate 5.

The plating 12 is made of, for example, Au, Ag, Sn, Ni, or the like. Each of the semiconductor elements S1 is bonded to the electrode pattern 3 via the bonding material 6 and the plating 12. That is, in the semiconductor device 100, the semiconductor element S1 is disposed.

It should be noted that the number of semiconductor elements S1 bonded to the electrode pattern 3 is not limited to two. The number of semiconductor elements S1 bonded to the electrode pattern 3 may be one or three or more depending on the application.

A cylindrical case 10 is connected to the base plate 11. The case 10 is made of resin. The case 10 is connected to the rim portion of the base plate 11 so as to surround each of the semiconductor elements S1, the semiconductor element substrate 5, and the like. That is, each of the semiconductor elements S1, the semiconductor element substrate 5, and the like are accommodated by the case 10 and the base plate 11.

The case 10 is provided with a terminal 9. An electrode (not shown) of each of the semiconductor elements S1 is connected to the terminal 9 by a wiring line 8. The wiring line 8 is made of, for example, Al, Au, or the like. The shape of the cross section of the wiring line 8 is a circle. The inside of the case 10 is filled with a sealing resin 7. The sealing resin 7 is, for example, a silicone gel, an epoxy resin, or the like.

The semiconductor element S1 is, for example, a wide band gap semiconductor. The wide band gap semiconductor is made of a material such as SiC or GaN, or diamond. That is, the band gap of the semiconductor element S1 is sufficiently larger than the band gap of the Si semiconductor. The semiconductor element S1 is a power semiconductor element such as a Metal-Oxide-Semiconductor Field-Effect Transistor (MOSFET) or an Insulated Gate Bipolar Transistor (IGBT), for example.

The semiconductor element S1 of the present embodiment is made of, for example, SiC. It should be noted that the semiconductor element S1 may be made of Si.

It should be noted that the semiconductor device 100 is not limited to the above configuration. For example, the insulating substrate 2 may be made of a material other than ceramic. The insulating substrate 2 may be made of, for example, a resin cured product in which ceramic powder is dispersed. The ceramic powder is $Al_2O_3$, AlN, $Si_3N_4$, or the like, for example. It should be noted that the ceramic powder may be $SiO_2$, BN, SiC, $B_2O_3$, or the like.

In addition, the insulating substrate 2 may be made of, for example, a resin cured product in which a ceramic plate is embedded. In addition, when the insulating substrate 2 is made of resin, the resin is an epoxy resin. It should be noted that when the insulating substrate 2 is made of resin, the resin may be another material having both an insulation property and an adhesion property.

In addition, the semiconductor device 100 may have a configuration in which the semiconductor element substrate 5 is integrated with the base plate 11.

In addition, each of the electrode patterns 3 and 4 and the base plate 11 may be made of a material having a predetermined heat dissipation characteristic other than copper. For example, each of the electrode patterns 3 and 4 and the base plate 11 may be made of aluminum, iron, or the like. In addition, each of the electrode patterns 3 and 4 and the base plate 11 may be made of a material obtained by compounding aluminum and iron. In addition, each of the electrode patterns 3 and 4 and the base plate 11 may be made of a material obtained by compounding copper, invar, and copper. In addition, each of the electrode patterns 3 and 4 and the base plate 11 may be made of an alloy such as SiCAl or CuMo.

In addition, the front surface of at least a part of the electrode pattern may be provided with minute unevenness. Thus, the adhesion between the electrode pattern and the resin can be improved. In addition, the front surface of at least a part of the electrode pattern may be provided with an adhesion improver used in primer treatment or the like.

In addition, the bonding material 6 may be bar solder or paste solder. In addition, the shape of the cross section of the wiring line 8 may be square. For example, the wiring line 8 may be made of a strip-shaped copper plate.

In addition, in the semiconductor device 100 in FIG. 1, four wiring lines 8 are used for electrically connecting the two semiconductor elements S1 to the terminals 9, but the present invention is not limited to this. The number of wiring lines 8 used in the semiconductor device 100 may be changed according to the current density and the like of the semiconductor element S1.

In addition, the bonding method of the wiring line 8 is, for example, a connection method of melting a metal piece such as copper or tin, ultrasonic bonding, or the like. It should be noted that the bonding method of the wiring line 8 may be another method as long as the other method is a method of capable of supplying the necessary current and voltage to the semiconductor element S1.

In addition, the resin forming the case 10 is desirable to be a resin with a high heat softening point. The resin is Poly Phenylene Sulfide (PPS) resin, for example. It should be noted that the resin forming the case 10 may be another material having an insulation property without thermally deforming in the temperature range in which the semiconductor device is used.

In addition, the sealing resin 7 is not limited to silicone gel, epoxy resin, or the like, and may be another resin having a desired elastic modulus and heat resistance.

In addition, the plating 12 may be made of a material other than the above materials as long as the material is a material through which necessary current and voltage can be supplied to the semiconductor element.

(Characteristic Configuration)

Next, the characteristic configuration of the present invention (hereinafter also referred to as a "configuration Ct1") will be described. The configuration Ct1 is a configuration for positioning the semiconductor element S1 with respect to the semiconductor element substrate 5 having an insulation property.

Figure 2:
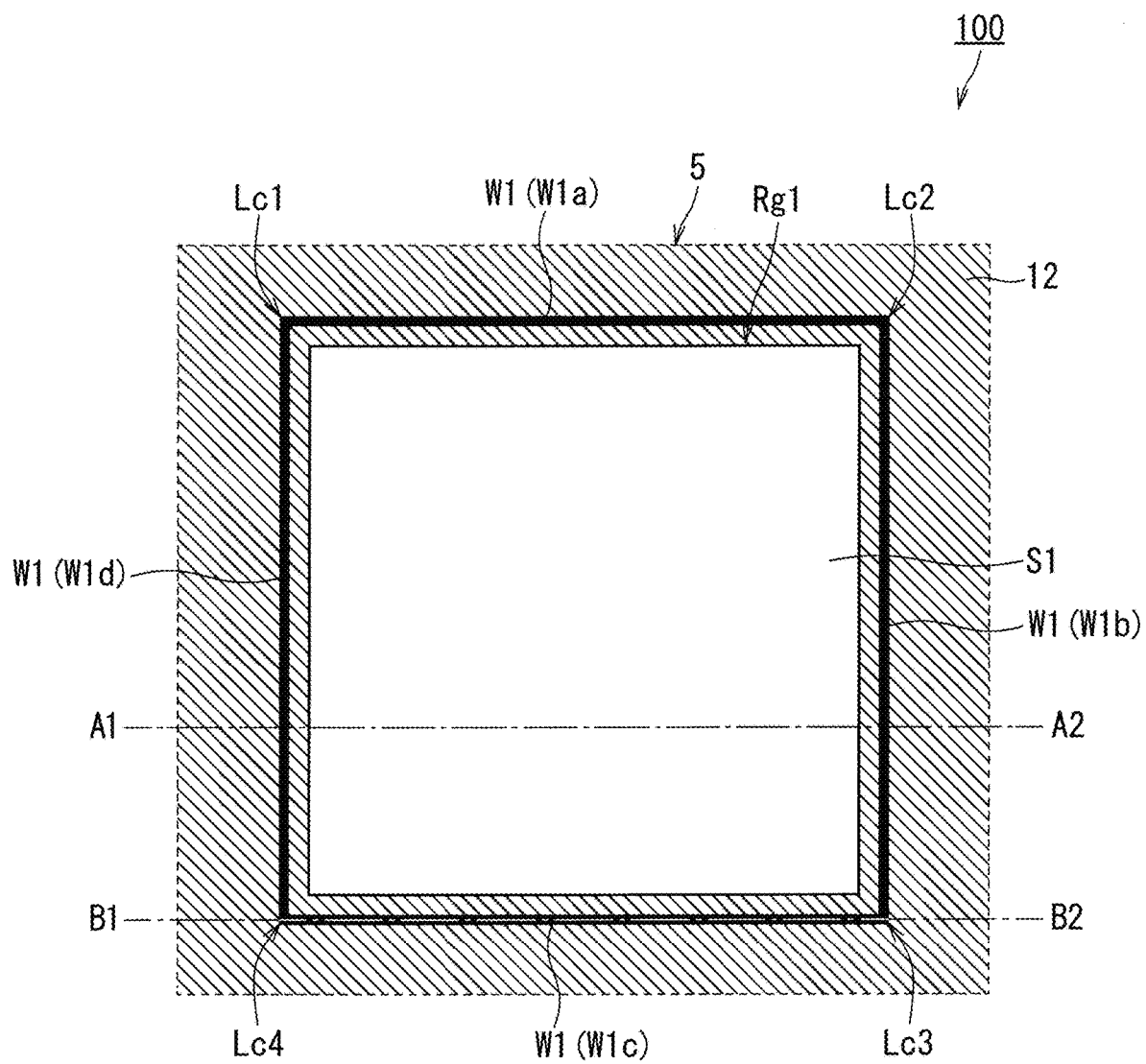
FIG. 2 is a diagram for illustrating a characteristic configuration of the first embodiment of the present invention.

FIG. 2 is a diagram for illustrating a characteristic configuration Ct1 of the first embodiment of the present invention. FIG. 2 shows a configuration of the semiconductor element S1 and the periphery of the semiconductor element S1. That is, FIG. 2 shows a part of the semiconductor device 100.

Figure 3:
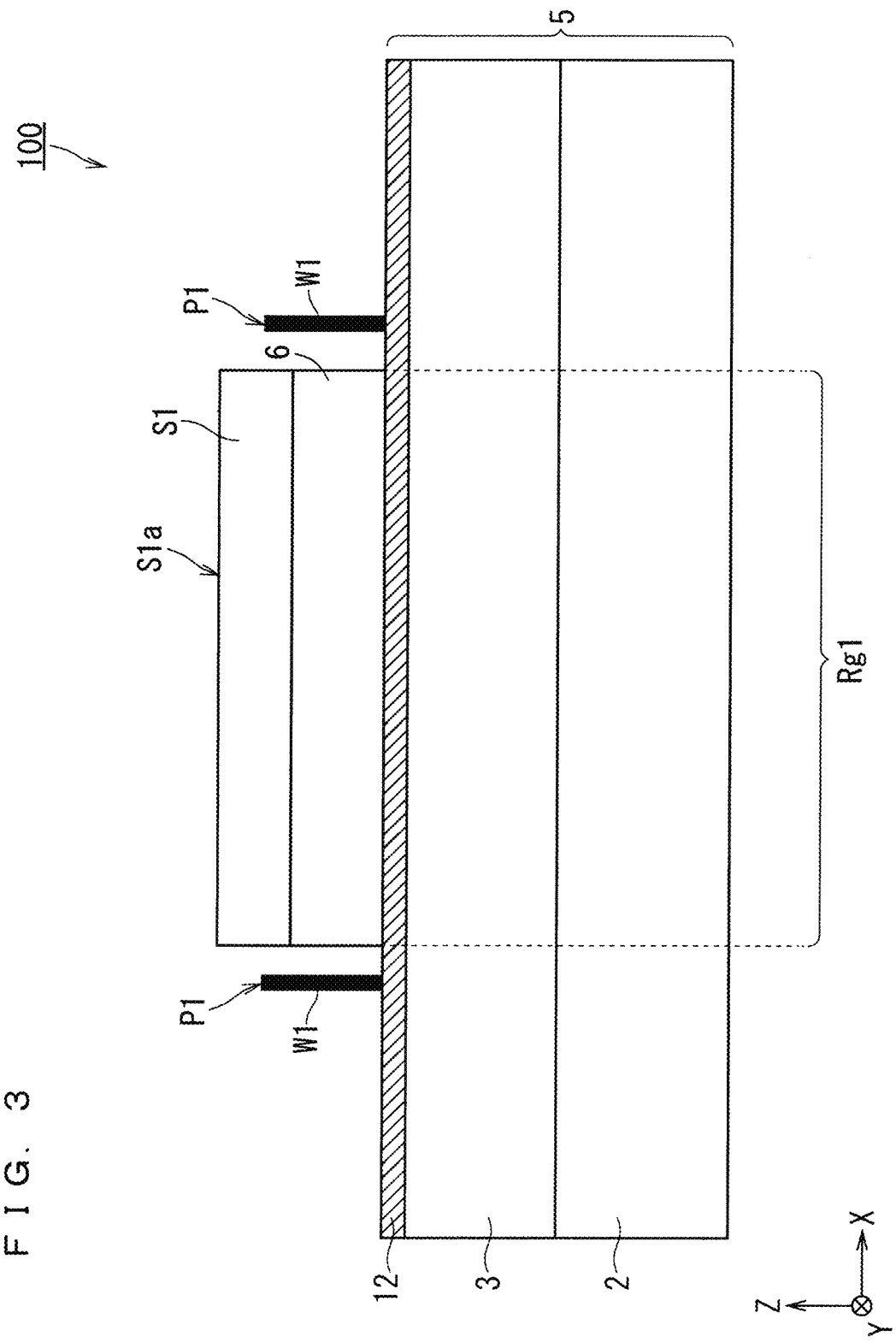
FIG. 3 is a cross-sectional view of a part of the semiconductor device according to the first embodiment of the present invention.
Figure 4:
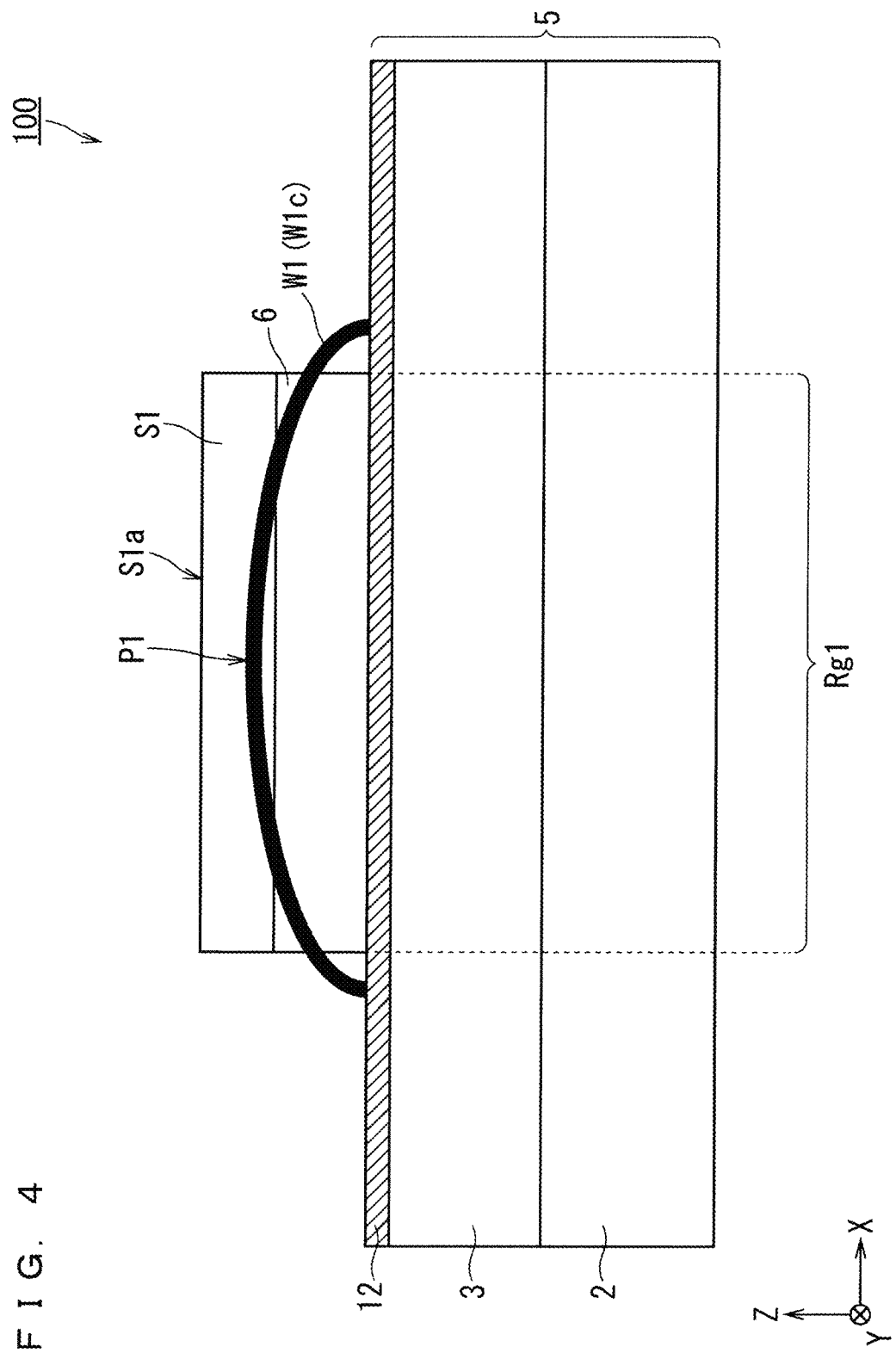
FIG. 4 is a cross-sectional view of another part of the semiconductor device according to the first embodiment of the present invention.

FIG. 3 is a cross-sectional view of the semiconductor device 100 taken along line A1-A2 in FIG. 2. It should be noted that in FIG. 3, the part not related to the configuration Ct1 (for example, electrode pattern 4) is not shown. FIG. 4 is a cross-sectional view of the semiconductor device 100 taken along line B1-B2 in FIG. 2. It should be noted that in FIG. 4, the part not related to the configuration Ct1 is not shown.

Referring to FIGS. 2, 3, and 4, the shape of semiconductor element S1 is, for example, plate-shaped. The thickness of the semiconductor element S1 is, for example, in the range of 10 μm to 100 μm. In addition, the shape of the semiconductor element S1 in a plan view (X-Y plane) is a quadrangle. The semiconductor element S1 has an upper surface S1a. The semiconductor element S1 is bonded to the semiconductor element substrate 5 via the bonding material 6.

Hereinafter, in the semiconductor element substrate 5, a region for disposing the semiconductor element S1 is also referred to as a "disposition region Rg1". That is, the semiconductor element substrate 5 includes a disposition region Rg1.

The shape and size of the disposition region Rg1 in a plan view (X-Y plane) are the same as the shape and size of the semiconductor element S1 in a plan view (X-Y plane). That is, the shape of the disposition region Rg1 in a plan view (X-Y plane) is a quadrangle.

It should be noted that FIG. 2 shows a state in which the semiconductor element S1 is disposed in the entire disposition region Rg1 of the semiconductor element substrate 5 via the bonding material 6. Hereinafter, the state in which the semiconductor element S1 is disposed in the entire disposition region Rg1 of the semiconductor element substrate 5 is also referred to as a "disposed state St1". In addition, hereinafter, the state in which the semiconductor element S1 is not disposed in the disposition region Rg1 of the semiconductor element substrate 5 is also referred to as a "non-disposed state Stn". The non-disposed state Stn is a state of the semiconductor device 100 in the middle of manufacture of the semiconductor device 100.

The semiconductor device 100 further includes a plurality of wires W1. Each of the wires W1 is made of, for example, an elastic material. Each of the wires W1 is made of, for example, a metal such as Cu, Au, or Al. The shape of the cross section of each of the wires W1 is, for example, a circle. The thickness of each of the wires W1 is, for example, in the range of 50 μm to 200 μm.

In the present embodiment, four wires W1 are provided with respect to one disposition region Rg1. Each of the wires W1 is a member for positioning the semiconductor element S1 with respect to the semiconductor element substrate 5 in a plan view (X-Y plane).

In the present embodiment, the shape of each of the wires W1 is arched as shown in FIG. 4. Hereinafter, the uppermost portion of the arched wire W1 is also referred to as an "uppermost portion P1". Both ends of each of the wires W1 are connected to the plating 12 (semiconductor element substrate 5) as shown in FIG. 4. It should be noted that connection of each of the wires W1 to the plating 12 is performed by wire bonding being a general connection method, for example. It should be noted that each of the wires W1 is connected to the plating 12 in the non-disposed state Stn.

Hereinafter, in the non-disposed state Stn in the middle of manufacturing the semiconductor device 100, a process for disposing the semiconductor element S1 in the disposition region Rg1 of the semiconductor element substrate 5 via the bonding material 6 is also referred to as a "disposing process Sp1". That is, in the disposing process Sp1, the semiconductor element S1 is bonded to the semiconductor element substrate 5 via the bonding material 6. The disposing process Sp1 is performed in a state where each of the wires W1 is connected to the plating 12.

In the disposed state St1 in which the semiconductor element S1 is disposed in the disposition region Rg1, the uppermost portion P1 of the wire W1 is at a position lower than the upper surface S1a of the semiconductor element S1 (see FIGS. 3 and 4).

In addition, the four wires W1 are connected to the semiconductor element substrate 5 (plating 12) so as to surround four sides of the disposition region Rg1 of the semiconductor element substrate 5. That is, the four wires W1 are provided at the periphery of the disposition region Rg1.

The periphery of the disposition region Rg1 is, for example, a closed loop shaped region (hereinafter, also referred to as a "loop region") surrounding the entire disposition region Rg1 in a plan view (X-Y plane). The width of the loop region is, for example, k times the length of one side of the disposition region Rg1. The k is a positive real number. The value of k is, for example, a value included in the range of 0.1 to 0.3.

Hereinafter, the four wires W1 provided for the disposition region Rg1 are also referred to as "wires W1a, W1b, W1c, and W1d". The wire W1a is connected to a position Lc1 and a position Lc2 in FIG. 2. Specifically, one end of the wire W1a is connected to the position Lc1, and the other end of the wire W1a is connected to the position Lc2.

In addition, the wire W1b is connected to the position Lc2 and a position Lc3. The wire W1c is connected to the position Lc3 and a position Lc4 (see FIG. 2). The wire W1d is connected to the position Lc4 and the position Lc1.

(Effect)

As described above, according to the present embodiment, the semiconductor device 100 includes the wire W1 for positioning the semiconductor element S1 with respect to the semiconductor element substrate 5. The semiconductor element substrate 5 includes a disposition region Rg1 for disposing the semiconductor element S1. The wire W1 is provided at least at a part of the periphery of the disposition region Rg1.

The wire is less likely to undergo deformation or the like than the resin due to the state of heat applied to the substrate. Therefore, with the above configuration, a semiconductor device capable of positioning a semiconductor element with almost no influence of heat applied to the substrate can be provided.

According to the present embodiment, each of the wires W1 is connected to the plating 12 (semiconductor element substrate 5) as shown in FIGS. 2, 3, and 4. Therefore, each of the wires W1 functions as a mark for the disposition of the semiconductor element S1. Therefore, the semiconductor element S1 can be accurately disposed in the disposition region Rg1 without using a jig or the like in the disposing process Sp1 described above.

Hereinafter, the situation in which the semiconductor element S1 is disposed at a position deviated from the disposition region Rg1 is also referred to as "positional deviation of the semiconductor element". It should be noted that if the positional deviation of the semiconductor element occurs, decrease in the contact area of the semiconductor element S1 with respect to the semiconductor element substrate 5 occurs, and the following malfunctions occur. The malfunction is the deterioration of the heat dissipation of the semiconductor element S1, for example. In addition, the malfunction is decrease in the current density of the semiconductor element S1, for example. If these malfunctions occur, the reliability of the semiconductor device is significantly reduced.

Thus, the semiconductor device 100 of the present embodiment has the above-described configuration Ct1. Therefore, when the disposing process Sp1 is performed, the occurrence of positional deviation of the semiconductor element can be suppressed.

In addition, in the present embodiment, the plating 12 is present on the entire front surface of the electrode pattern 3 being a portion on which the semiconductor element S1 is to be disposed in the semiconductor element substrate 5. Therefore, the position of the wire W1 can be easily changed.

Thus, the semiconductor element substrates 5 of various forms can also be easily coped with by changing the position of the wire. The semiconductor element substrates 5 of various forms are semiconductor element substrates 5 of a plurality of types of forms different in the dimensions of the semiconductor element, the number of the semiconductor elements to be disposed, and the like, for example. In addition, changing the conditions of wire bonding in accordance with the shape of the semiconductor element, the number of semiconductor elements, and the like allows the semiconductor element to be disposed at any place in the region where the plating 12 exists. Therefore, the disposition of semiconductor elements with high versatility can be achieved.

It should be noted that if the uppermost portion of the wire is at a higher position than the upper surface of the semiconductor element, the insulation distance between the wire and the upper surface of the semiconductor element may decrease, and a short circuit may occur. It should be noted that in the present embodiment, as shown in FIGS. 3 and 4, in the disposed state St1 in which the semiconductor element S1 is disposed in the disposition region Rg1, the uppermost portion P1 of the wire W1 is present at a position lower than the upper surface S1a of the semiconductor element S1. Thus, since the above insulation distance does not become small, occurrence of malfunctions such as a short circuit can be suppressed more effectively.

In addition, in the present embodiment, the semiconductor element S1 is made of SiC. Thus, miniaturization of the semiconductor element S1 can be achieved. In addition, the spacing between two adjacent semiconductor elements S1 can be shortened. In addition, positioning of the semiconductor element S1 without using a jig is effective. In addition, a substrate developed for Si can be diverted also to the semiconductor element S1.

It should be noted that the related configuration A described above is a configuration for positioning only one type of semiconductor element having a predetermined size. Therefore, in the related configuration A, in order to produce a plurality of types of semiconductor devices different in the shape of the semiconductor element, the number of semiconductor elements, and the like, it is necessary to reexamine the structure of the substrate. That is, the related configuration A has a problem that the production of a plurality of types of semiconductor devices cannot be coped with.

In addition, in the related configuration B, the thermosetting resin material is used to position the semiconductor element. However, thermosetting resin materials have almost no heat resistance. Therefore, in the related configuration B, there are many restrictions on the bonding material of the semiconductor element, the bonding process of the semiconductor element, and the like. In addition, due to the difference in the linear expansion coefficient between the insulating substrate and the semiconductor element, peeling of the resin material may occur. Therefore, in the related configuration B, there is a problem that the reliability of the semiconductor device is low.

In addition, in the conventional semiconductor device, positioning of the semiconductor element with respect to the semiconductor element substrate having an insulation property has been performed by mainly using a jig made of carbon.

Specifically, in order that positional deviation of the semiconductor element is prevented, positioning of the semiconductor element has been performed in a state where a jig made of carbon is provided on the semiconductor element substrate.

When positional deviation of the semiconductor element is suppressed by using a jig, the entire bottom surface of the jig needs to be in contact with the semiconductor element substrate. If there is a portion, out of the bottom surface of the jig, not in contact with the semiconductor element substrate, the positioning accuracy of the semiconductor element may be degraded, which may cause positional deviation of the semiconductor element.

In addition, depending on the structure of the semiconductor device, there is a problem that the positioning of the semiconductor element using a jig is difficult due to the warpage of the substrate and the variation in dimension or the like of the substrate. Specifically, in a state where there is no warpage in the base plate provided with the semiconductor element substrate, the jig comes into contact with the semiconductor element substrate with high accuracy.

On the other hand, when there is warpage in both or one of the semiconductor element substrate and the base plate, the entire bottom surface of the jig does not come into contact with the semiconductor element substrate. In this case, positional deviation of solder (bonding material) may occur. In particular, positional deviation of solder is likely to occur when the semiconductor element is thin. With the occurrence of positional deviation of solder, positional deviation of the semiconductor element also occurs.

In addition, in order to produce a plurality of types of semiconductor devices different in the shape, the number, and the like of semiconductor elements, it is necessary to prepare a plurality of types of jigs. For example, every time a semiconductor device mounted with a semiconductor element having a different outer shape is developed, it is necessary to create a dedicated jig that fits the semiconductor device. Dedicated jigs are very expensive. Therefore, there is a problem of being very expensive.

Thus, the semiconductor device 100 according to the present embodiment is configured as described above. Therefore, the above problems can be solved by the semiconductor device 100 of the present embodiment. For example, various forms of semiconductor elements can be positioned without using a jig. Therefore, a highly versatile semiconductor device can be obtained. In addition, positioning of the semiconductor element can be performed without being affected by the warpage of the semiconductor element substrate and the base plate. As a result, a highly reliable semiconductor device can be obtained.

In addition, in the present embodiment, a wire is provided at the periphery of the disposition region Rg1 where the semiconductor element is to be disposed. Therefore, regardless of the presence or absence of warpage in the semiconductor element substrate and the base plate, it is possible to suppress the positional deviation of solder. The positional deviation of the solder is positional deviation accompanying the movement of the semiconductor element when solder bonding is performed, for example. In addition, the positional deviation of the solder is positional deviation caused by the air flow in the semiconductor device when the pressure is reduced, for example. Suppressing the positional deviation of the solder allows the positional deviation of the semiconductor element to be suppressed.

In addition, it is possible to cope with the positioning of various semiconductor elements only by changing the conditions of wire bonding without using a jig.

Here, it is assumed that warpage of about 100 μm occurs in the insulating substrate 2 (semiconductor element substrate 5). It should be noted that the semiconductor element S1 is thin. Specifically, the thickness of the semiconductor element S1 is in the range of 10 μm to 100 μm. In this case, positioning of the semiconductor element S1 using a jig is difficult. On the other hand, in the semiconductor device 100 of the present embodiment, positioning of the semiconductor element S1 can be performed without using a jig. Therefore, the configuration Ct1 of the present embodiment is effective in a state where the semiconductor element S1 is thin. The state where the semiconductor element S1 is thin is a state where the thickness of the semiconductor element S1 is in the range of 10 μm to 100 μm, for example.

As described above, according to the present embodiment, providing the wire at the periphery of the disposition region Rg1 allows positional deviation of solder to be suppressed and allows positional deviation of the semiconductor element to be suppressed. As a result, a semiconductor device with high reliability and high versatility can be obtained.

It should be noted that as shown in FIG. 1, the semiconductor device 100 has a configuration in which the inside of the case 10 is filled with the sealing resin 7, but the present invention is not limited to this. The semiconductor device 100 may have a configuration having a mold type structure without using a case. The various effects described above can be obtained also in the configuration.

<First Modification of First Embodiment>

Figure 5:
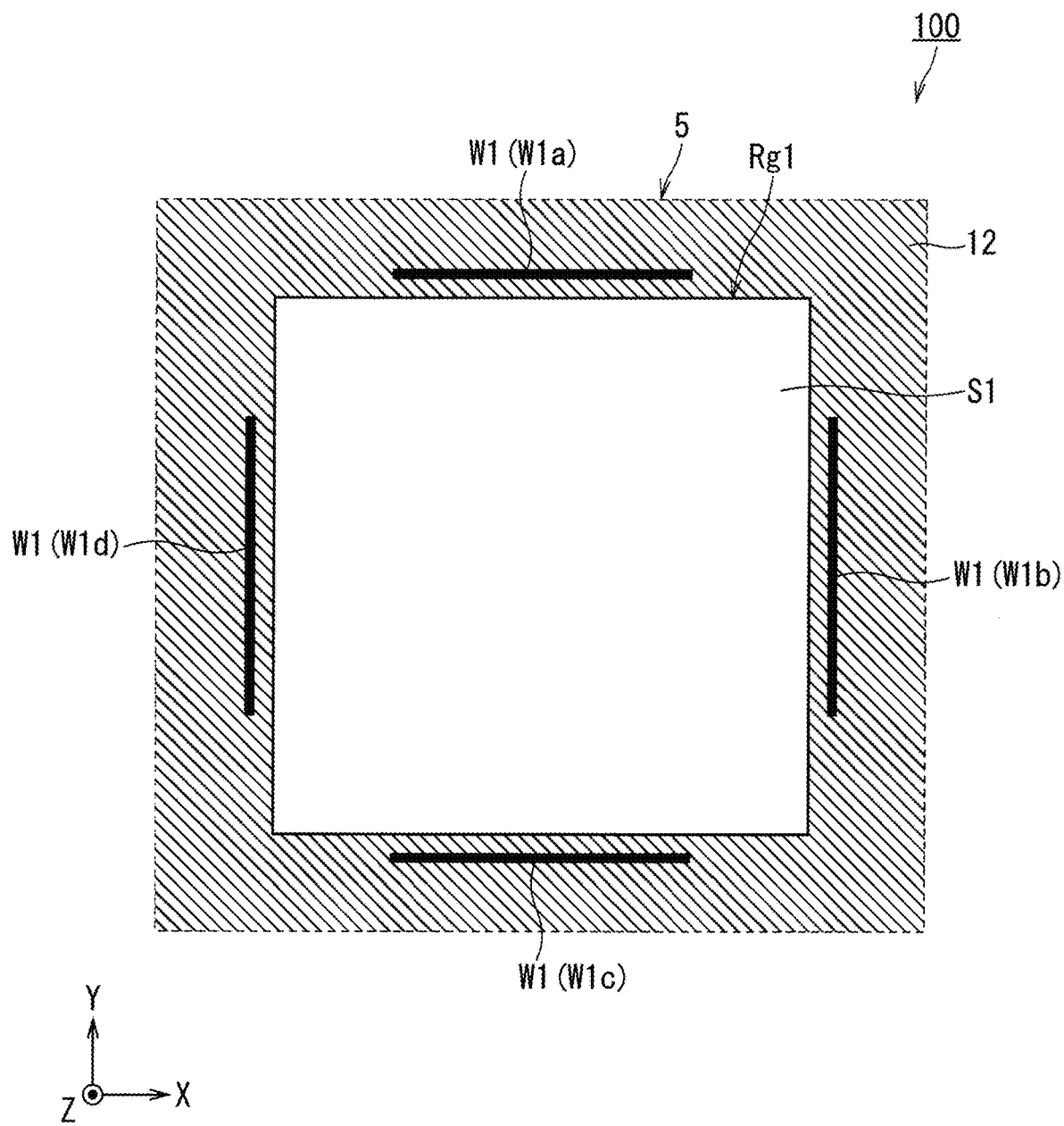
FIG. 5 is a diagram showing a configuration according to a first modification of the first embodiment of the present invention.

The present modification has a configuration in which the wire W1 is provided at a part of the periphery of the disposition region Rg1 (hereinafter, also referred to as a "configuration Ctm1"). FIG. 5 is a diagram showing the configuration Ctm1 according to the first modification of the first embodiment of the present invention. Referring to FIG. 5, the semiconductor element S1 in a plan view (X-Y plane) has four corner portions. In the configuration Ctm1, in the disposed state St1 in which the semiconductor element S1 is disposed in the disposition region Rg1, the wire W1 is provided so that each of the wires W1 is not in contact with the corner portion of the semiconductor element S1.

It should be noted that the disposition region Rg1 in a plan view (X-Y plane) has four corner portions. Specifically, four wires W1 are provided in regions other than the periphery of each of the corner portions of the disposition region Rg1 out of the periphery of the disposition region Rg1. That is, each of the wires W1 is provided at least at a part of the periphery of the disposition region Rg1. It should be noted that the shape of each of the four wires W1 in the configuration Ctm1 is arched as shown in FIG. 4. The four wires W1 are connected to the plating 12 (semiconductor element substrate 5) as in the first embodiment.

In addition, in the configuration Ctm1, in the disposed state St1 in which the semiconductor element S1 is disposed in the disposition region Rg1, the uppermost portion P1 of the wire W1 is present at a position lower than the upper surface S1a of the semiconductor element S1.

According to the present modification, it is possible to suppress the corner portion of the semiconductor element S1 from coming into contact with the wire W1 when the above-described disposing process Sp1 is performed. Therefore, it is possible to suppress the corner portion of the semiconductor element S1 from being broken in the disposing process Sp1. In addition, also in the present modification, the effect of the first embodiment can be obtained. For example, positional deviation of the semiconductor element can be suppressed.

<Second Modification of First Embodiment>

Figure 6:
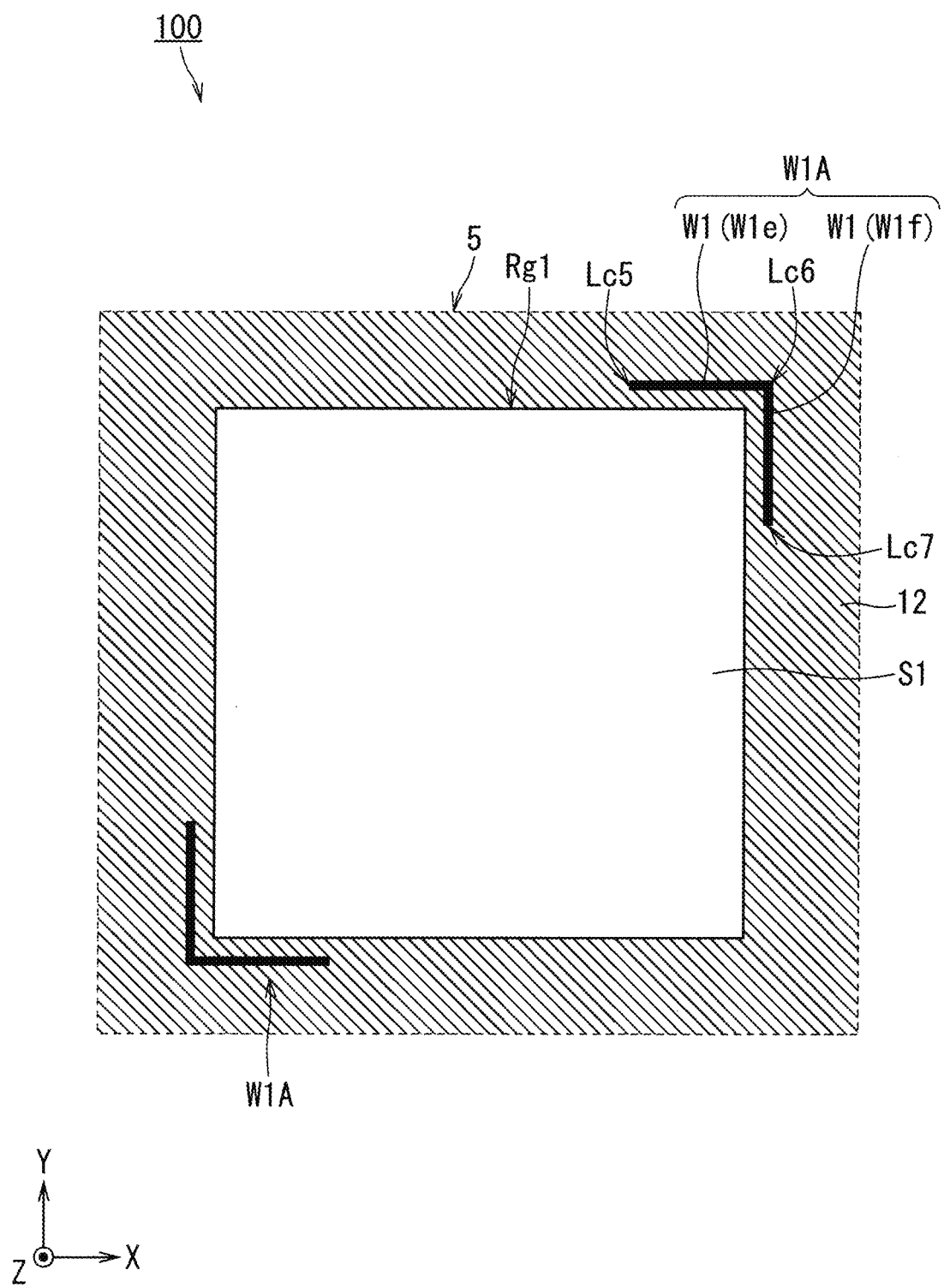
FIG. 6 is a diagram showing a configuration according to a second modification of the first embodiment of the present invention.

The present modification has another configuration in which the wire W1 is provided at a part of the periphery of the disposition region Rg1 (hereinafter, also referred to as a "configuration Ctm2"). FIG. 6 is a diagram showing the configuration Ctm2 according to the second modification of the first embodiment of the present invention.

Referring to FIG. 6, in the configuration Ctm2, wires W1A are provided at the periphery of two corner portions out of four corner portions of the disposition region Rg1. That is, each of two opposing corner portions included in the disposition region Rg1 is surrounded by the wire W1A. In other words, two wires W1A surround the two corner portions, respectively.

The wire W1A includes two wires W1. Hereinafter, the two wires W1 included in the wire W1A are also referred to as "wires W1e and W1f". The shape of each of the wires W1e and W1f is arched as shown in FIG. 4.

One end of the wire W1e is connected to a position Lc5. The other end of the wire W1e is connected to a position Lc6. One end of the wire W1f is connected to the position Lc7. The other end of the wire W1f is connected to the position Lc6. That is, two opposing corner portions included in the disposition region Rg1 are surrounded by the two respective wires W1 (wires W1e and W1f).

In addition, in the configuration Ctm2, in the disposed state St1 in which the semiconductor element S1 is disposed in the disposition region Rg1, the uppermost portion P1 of each of the wires W1 is present at a position lower than the upper surface S1a of the semiconductor element S1.

According to the present modification, wire bonding has only to be performed on the periphery of the two corner portions of the disposition region Rg1. Therefore, shortening of the connection process of the wire and reduction in material cost can be achieved.

It should be noted that in the present modification, the wire W1A includes two wires W1, but the present invention is not limited to this. The wire W1A may include one wire W1.

Second Embodiment

In the semiconductor device 100, the semiconductor element S1 is bonded to the semiconductor element substrate 5 via the bonding material 6. The bonding material 6 has a characteristic of dissipating the heat generated by the semiconductor element S1. If the above disposing process Sp1 is performed in a state where the thickness of the bonding material 6 is not uniform, the following malfunctions may occur.

The malfunction is a malfunction that stress concentrates on a place where the bonding material 6 is thin and the reliability of the semiconductor device is lowered, for example. In addition, the malfunction is a malfunction that the semiconductor element Si inclines, for example. When the semiconductor element S1 inclines, a place where the bonding material does not exist occurs in the lower portion of the semiconductor element S1, and the heat dissipation is lowered.

It is conceivable to increase the amount of the bonding material in order to prevent the occurrence of the place where the bonding material does not exist in the lower portion of the semiconductor element S1. However, when the amount of the bonding material is increased, the thickness of the bonding material is increased, so that there is a problem that the thermal resistance of the bonding material 6 is increased.

The present embodiment shows a configuration for solving the above problem. Specifically, the present embodiment has a configuration in which a part of the wire W1 exists below the semiconductor element S1 (hereinafter, also referred to as a "configuration Ct2").

The configuration Ct2 is a configuration in which only the disposed state of the wire W1 is changed in the semiconductor device 100 of the first embodiment. Therefore, the configuration of the semiconductor device 100 to which the configuration Ct2 is applied is the same as that of the first embodiment, except for the disposed state of the wire W1 in the semiconductor device 100.

Figure 7:
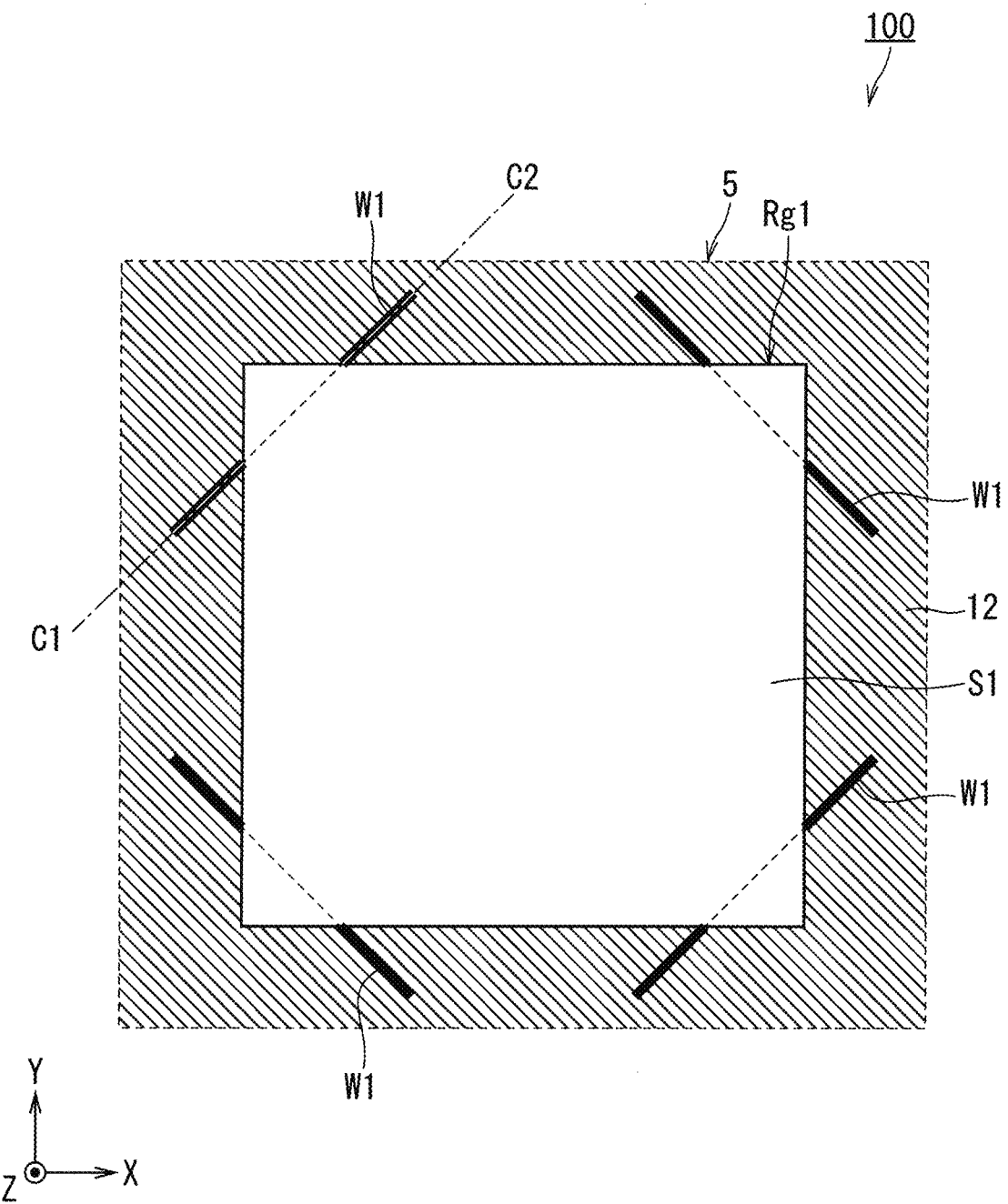
FIG. 7 is a diagram for illustrating a configuration of a second embodiment of the present invention.
Figure 8:
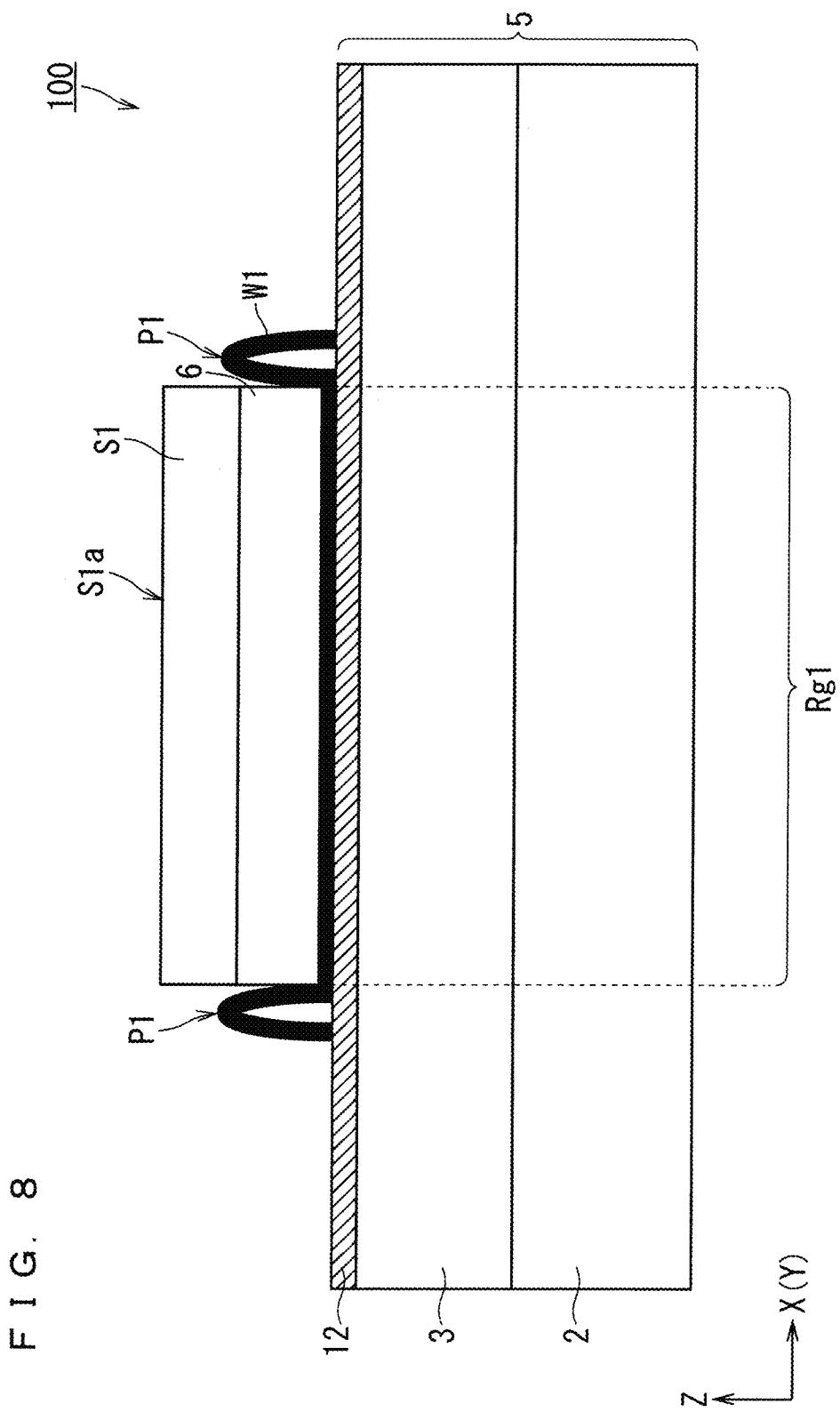
FIG. 8 is a cross-sectional view of a part of the semiconductor device according to the second embodiment of the present invention.

FIG. 7 is a diagram for illustrating the configuration Ct2 of the second embodiment of the present invention. FIG. 7 shows a configuration Ct2 at the same portion as a part of the semiconductor device 100 shown in FIG. 2. FIG. 8 is a cross-sectional view of the semiconductor device 100 to which the configuration Ct2 is applied, taken along line C1-C2 in FIG. 7.

Referring to FIGS. 7 and 8, in the configuration Ct2, a part of each of the wires W1 is provided in the bonding material 6 existing between the semiconductor element S1 and the semiconductor element substrate 5. Specifically, in the disposed state St1 in which the semiconductor element S1 is disposed in the disposition region Rg1, a part of each of the wires W1 is present below the semiconductor element S1.

More specifically, as shown in FIGS. 7 and 8, four wires W1 are provided at four corner portions of the disposition region Rg1, respectively. It should be noted that each of the wires W1 is connected to the plating 12 as shown in FIG. 8. It should be noted that in the present embodiment, each of the wires W1 is made of, for example, Al.

It should be noted that the shapes of one end portion and the other end portion of the wire W1 are arched. In order that the shape of one end portion of the wire W1 is arched, the end of the one end portion is connected to the plating 12. In addition, in order that the shape of the other end portion of the wire W1 is arched, the end of the other end portion is connected to the plating 12. For example, ultrasonic bonding is used for connecting the wire W1. It should be noted that the connection of the wire W1 may be performed by a method other than ultrasonic bonding.

In addition, in the disposed state St1 in which the semiconductor element S1 is disposed in the disposition region Rg1, the uppermost portion P1 of each of the wires W1 is present at a position lower than the upper surface S1a of the semiconductor element S1.

In the above configuration, in the above disposing process Sp1, supplying the bonding material to the disposition region Rg1 provides a part of each of the wires W1 inside the bonding material 6. Therefore, for example, as in the configuration of Japanese Patent No. 3347279, the thickness of the bonding material 6 can be made uniform. Thus, the distance from the semiconductor element S1 to the semiconductor element substrate 5 can be made constant. As a result, the reliability of the semiconductor device 100 can be secured.

It should be noted that the thickness of each of the wires W1 is preferably in the range of 50 μm to 200 μm. Thus, it is possible to suppress the thickness of the bonding material 6 from increasing and to suppress the thermal resistance of the bonding material 6 from increasing.

It should be noted that the disposition place of each of the wires W1, the spacing between the adjacent wires W1, and the like are not limited to the above structure. For example, the number of disposition places of the wire W1 is not limited to four. The wire W1 has only to be disposed so as to be capable of suppressing the occurrence of the inclination of the semiconductor element S1. For example, three wires W1 may be provided below the three corner portions of the semiconductor element S1, respectively.

As described above, according to the present embodiment, it is possible to make the thickness of the bonding material 6 uniform in a state where the bonding material is supplied to the disposition region Rg1 by the disposing process Sp1. That is, providing the wire W1 in advance in the disposition region Rg1 where the bonding material is to be supplied allows the thickness of the bonding material to be controlled. Therefore, it is possible to prevent stress concentration and the like that occur in a state where the thickness of the bonding material is small.

As described above, a semiconductor device with high reliability and high versatility can be obtained. In addition, according to the present embodiment, each of the wires W1 is provided at the periphery of the disposition region Rg1. Thus, the same effect as that of the first embodiment can be obtained. For example, it is possible to suppress the occurrence of positional deviation of the bonding material 6 (solder) and to suppress positional deviation of the semiconductor element.

Third Embodiment

Hereinafter, the semiconductor device 100 according to any one of the first embodiment, the first modification, the second modification, and the second embodiment is also referred to as a "semiconductor device Dv1". The configuration of the present embodiment is a configuration in which the semiconductor device Dv1 is applied to a power conversion apparatus (hereinafter, also referred to as a "configuration Ct3"). Hereinafter, the power conversion apparatus in the configuration Ct3 is also referred to as a "power conversion apparatus 800". The power conversion apparatus 800 is an apparatus using the semiconductor device Dv1.

The power conversion apparatus 800 is, for example, a three-phase inverter. Hereinafter, the power conversion system to which the power conversion apparatus 800 is applied is also referred to as a "power conversion system SY1".

Figure 9:
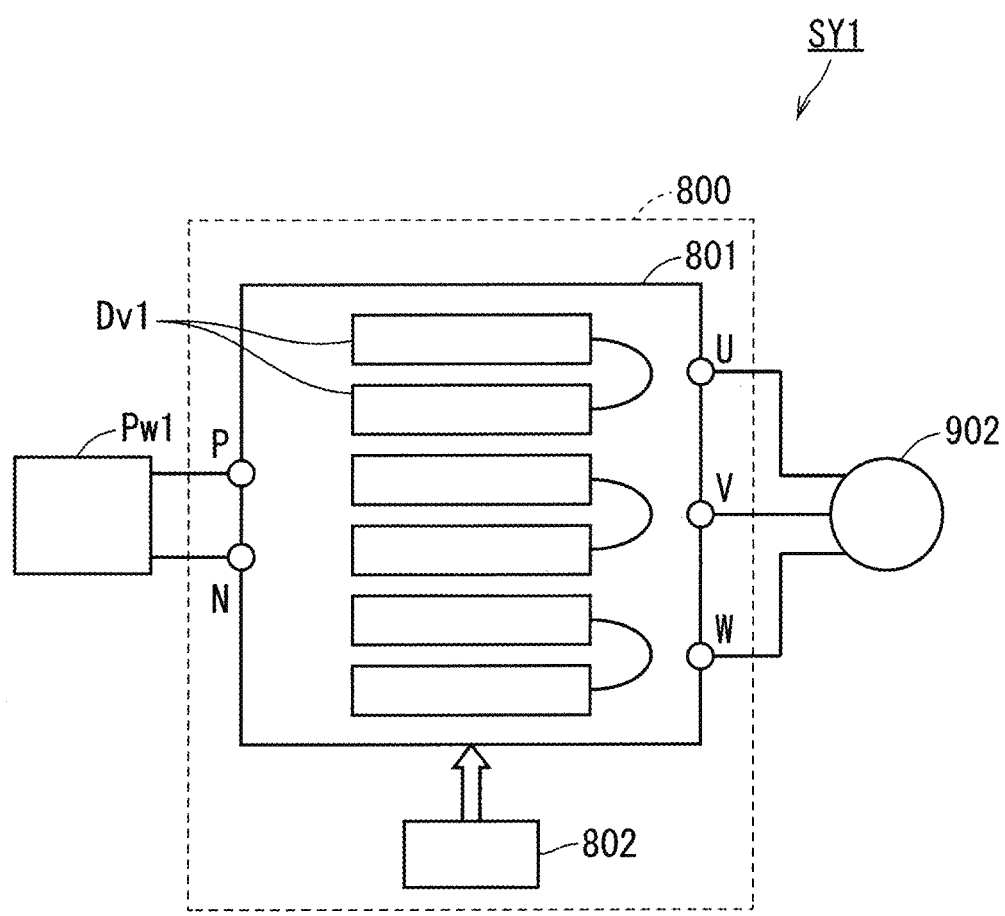
FIG. 9 is a block diagram showing a configuration of a power conversion system according to a third embodiment of the present invention.

FIG. 9 is a block diagram showing a configuration of the power conversion system SY1 according to the third embodiment of the present invention. Referring to FIG. 9, the power conversion system SY1 includes a power supply Pw1, a power conversion apparatus 800, and a load 902.

The power supply Pw1 is, for example, a DC power supply. The power supply Pw1 supplies DC power to the power conversion apparatus 800. The power source Pw1 includes various components. The power supply Pw1 is, for example, a battery connected to a DC system. In addition, the power supply Pw1 may be, for example, a solar battery, a storage battery, or the like.

It should be noted that the power supply Pw1 may be a power supply connected to an AC system. In this case, the power supply Pw1 includes a rectifier circuit and an AC/DC converter. In addition, the power supply Pw1 may include a DC/DC converter for converting DC power output from the DC system into predetermined power.

The power conversion apparatus 800 is, for example, a two-level power conversion apparatus. The power conversion apparatus 800 is provided between the power supply Pw1 and the load 902. The power conversion apparatus 800 is electrically connected to the power supply Pw1 and the load 902. The power conversion apparatus 800 has a function of converting DC power into AC power and outputting the AC power.

As shown in FIG. 9, the power conversion apparatus 800 includes a power conversion circuit 801 and a control circuit 802. The power conversion circuit 801 has a function of converting input power and outputting the converted power. Specifically, the power conversion circuit 801 has a function of converting DC power into AC power and outputting the AC power.

The control circuit 802 outputs a control signal for controlling the power conversion circuit 801 to the power conversion circuit 801. For example, the control circuit 802 outputs a control signal for controlling the switching operation of the power conversion circuit 801 to the power conversion circuit 801. The power conversion circuit 801 converts DC power supplied from the power supply Pw1 into AC power based on the control signal. Then, the power conversion circuit 801 supplies the AC power to the load 902.

The power conversion circuit 801 is, for example, a two-level three-phase full bridge circuit. The power conversion circuit 801 includes two semiconductor devices Dv1 connected in series corresponding to each of the U phase, V phase, and W phase. That is, the power conversion circuit 801 includes six semiconductor devices Dv1.

The load 902 is a three-phase motor driven by AC power supplied from the power conversion apparatus 800. It should be noted that the load 902 is not limited to a specific application, and is a motor mounted on various electric apparatuses. The load 902 may be a motor used in a hybrid vehicle, an electric vehicle, or the like, for example. In addition, the load 902 may be a motor used in a railway vehicle, for example. In addition, the load 902 may be a motor used in an elevator, an air conditioner, or the like, for example.

(Effect)

As described above, the power conversion apparatus 800 includes a power conversion circuit 801 and a control circuit 802. The power conversion circuit 801 includes a semiconductor device Dv1. The semiconductor device Dv1 is the semiconductor device 100 according to any one of the first embodiment, the first modification, the second modification, and the second embodiment.

Therefore, the semiconductor device Dv1 is a highly reliable device that can suppress the positional deviation of the semiconductor element. Therefore, the power conversion apparatus 800 including the semiconductor device Dv1 can stably convert power.

It should be noted that in the present embodiment, an example in which the present invention is applied to a two-level power conversion apparatus (three-phase inverter) is described, but the present invention is not limited to this, and can be applied to various power conversion apparatuses.

In addition, the power conversion apparatus 800 according to the present embodiment is not limited to a two-level power conversion apparatus, and the power conversion apparatus 800 may be a three-level power conversion apparatus. In addition, the power conversion apparatus 800 may be a multilevel power conversion apparatus. When power is supplied to a single-phase load, the present invention may be applied to a single-phase inverter. In addition, when power is supplied to a DC load or the like, the present invention can also be applied to a DC/DC converter or an AC/DC converter.

In addition, the power conversion apparatus to which the present invention is applied is not limited to the configuration in which the load 902 described above is a motor. The power conversion apparatus to which the present invention is applied may be a power supply apparatus such as an electric discharge machine or a laser processing machine, for example. In addition, the power conversion apparatus to which the present invention is applied may be a power supply apparatus such as an induction heating cooker or a noncontact power feeding system, for example. In addition, the power conversion apparatus to which the present invention is applied may be a power conditioner such as a solar power generation system or a storage system.

It should be noted that in the present invention, each of the embodiments and each of the modifications can be freely combined, and each of the embodiments and each of the modifications can be appropriately modified or omitted within the scope of the present invention.

For example, the plating 12 is set to be present on the entire front surface of the electrode pattern 3 on which the semiconductor element S1 is to be disposed, but the present invention is not limited thereto. For example, the plating 12 may be present only in the region within which the position of the wire W1 is to be changed out of the front surface of the electrode pattern 3.

Although the present invention is described in detail, the above description is in all aspects illustrative, and the present invention is not limited to the above description. It is understood that innumerable modifications not illustrated can be envisaged without departing from the scope of the present invention.

EXPLANATION OF REFERENCE SIGNS

5: semiconductor element substrate
12: plating
100, Dv1: semiconductor device
800: power conversion apparatus
801: power conversion circuit
802: control circuit
S1: semiconductor element
W1, W1a, W1A, W1b, W1c, W1d, W1e, W1f: wire

The invention claimed is:

1. A semiconductor device in which a semiconductor element is disposed, the semiconductor device comprising:
   a substrate having an insulation property and including a disposition region on which the semiconductor element is disposed via a bonding material in a plan view; and
   a wire provided at least at a part of a periphery of the disposition region, wherein
   a part of the wire is present inside the bonding material that bonds the semiconductor element to the substrate.

2. The semiconductor device according to claim 1, wherein
   plating is present on a front surface on which at least the semiconductor element and the wire are provided.

3. The semiconductor device according to claim 1, wherein
   the wire is arched, and an uppermost portion of the arched wire is present at a position higher than the disposition region of the substrate and lower than an upper surface of the semiconductor element.

4. The semiconductor device according to claim 1, wherein
   a shape of the semiconductor element in a plan view is a quadrangle, and
   the wire is provided so that the wire is not in contact with a corner portion of the semiconductor element disposed in the disposition region.

5. The semiconductor device according to claim 1, wherein
   a thickness of the semiconductor element is in a range of 10 μm to 100 μm.

6. The semiconductor device according to claim 1, wherein
   the semiconductor element is made of SiC.

7. A power conversion apparatus using the semiconductor device according to claim 1, the power conversion apparatus comprising:
   a power conversion circuit that includes the semiconductor device, the power conversion circuit configured to convert power to be input, the power conversion circuit configured to output the converted power; and
   a control circuit configured to output a control signal for controlling the power conversion circuit to the power conversion circuit.

8. The semiconductor device according to claim 1, wherein
   the wire is made of a metal containing one of Cu, Au, and Al, and has a thickness in a range of 50 μm to 200 μm.

9. A method for manufacturing a semiconductor device that includes disposing a semiconductor element on a substrate having an insulation property and including a disposition region on which the semiconductor element is disposed via a bonding material, the method comprising:
   providing a wire at least at a part of a periphery of the disposition region; and
   disposing the bonding material and the semiconductor element in the disposition region on which the wire is provided, wherein
   in the providing the wire, the wire is provided so that a part of the wire is present inside the bonding material that bonds the semiconductor element to the substrate.

* * * * *